(12) United States Patent
Lee et al.

(10) Patent No.: US 6,489,905 B1
(45) Date of Patent: Dec. 3, 2002

(54) SEGMENTED DAC CALIBRATION CIRCUITRY AND METHODOLOGY

(75) Inventors: Yvette P. Lee; Marwan M. Hassoun, both of Austin, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/925,183

(22) Filed: Aug. 8, 2001

(51) Int. Cl.$^7$ ................................................ H03M 1/10
(52) U.S. Cl. ........................................ 341/120; 341/145
(58) Field of Search ................................ 341/118, 119, 341/120, 121, 144, 145, 153

(56) References Cited

U.S. PATENT DOCUMENTS

| | | |
|---|---|---|
| 5,446,455 A | 8/1995 | Brooks |
| 5,666,118 A | 9/1997 | Gersbach |
| 5,703,586 A * | 12/1997 | Tucholski .................. 341/144 |
| 5,955,980 A | 9/1999 | Hanna |
| 6,329,941 B1 * | 12/2001 | Farooqi ...................... 341/145 |

OTHER PUBLICATIONS

Bastos et al., A 12–Bit Intrinsic Accuracy HIgh–Speed CMOS DAC,IEEE Journal of Solid–State Circuits, vol. 33, No. 12, Dec. 1998, pp. 1959–1969.*

* cited by examiner

*Primary Examiner*—Howard L. Williams
(74) *Attorney, Agent, or Firm*—Fogg Slifer Polglaze

(57) ABSTRACT

A segmented digital-to-analog converter (DAC) has been described that uses a two-step calibration process to calibrate current sources to a single primary reference source. In one embodiment, the DAC includes sub-DACs, a reference generator circuit and a primary, or golden, reference source. Current sources of both the sub-DACs and the reference generator are calibrated to a golden current source or primary reference current. In one embodiment, the current sources each include a transistor coupled so that a gate voltage can be adjusted during calibration. The multiple current sources of the reference generator are first calibrated to the primary reference source. The calibrated output currents of the reference generator are then used to calibrate current sources in the sub-DACs.

33 Claims, 5 Drawing Sheets

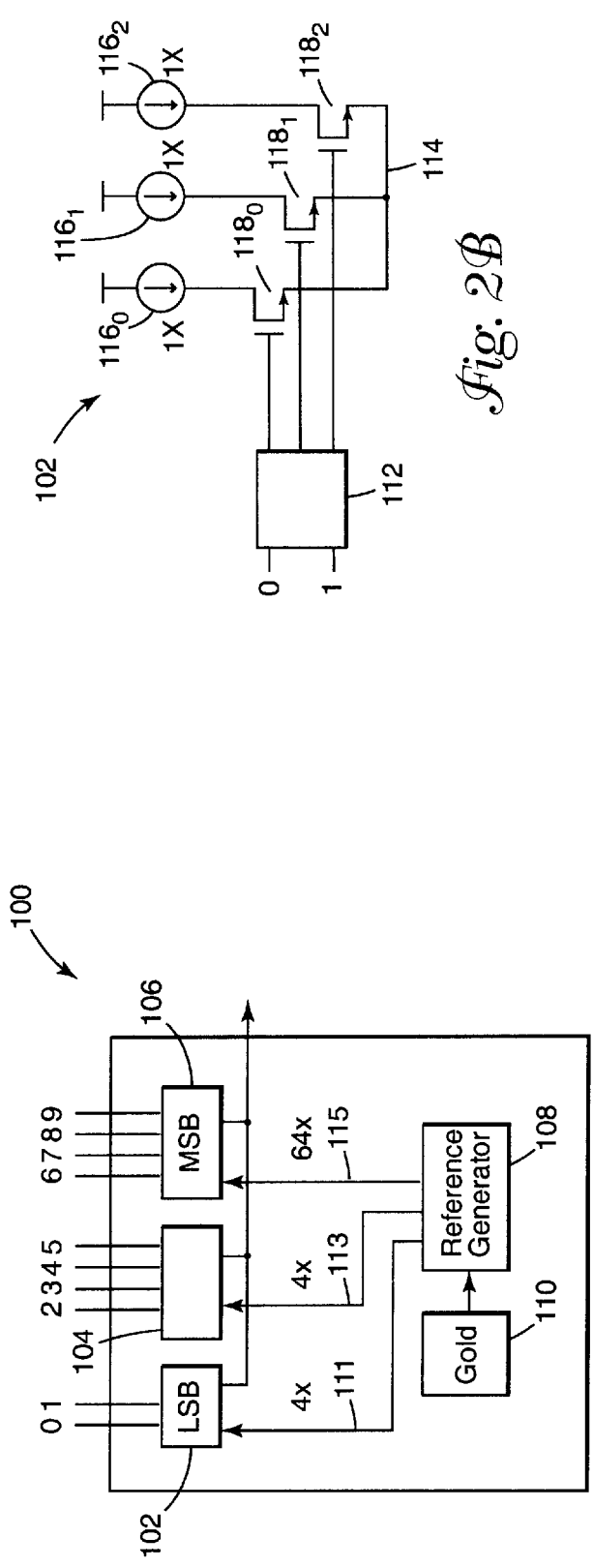
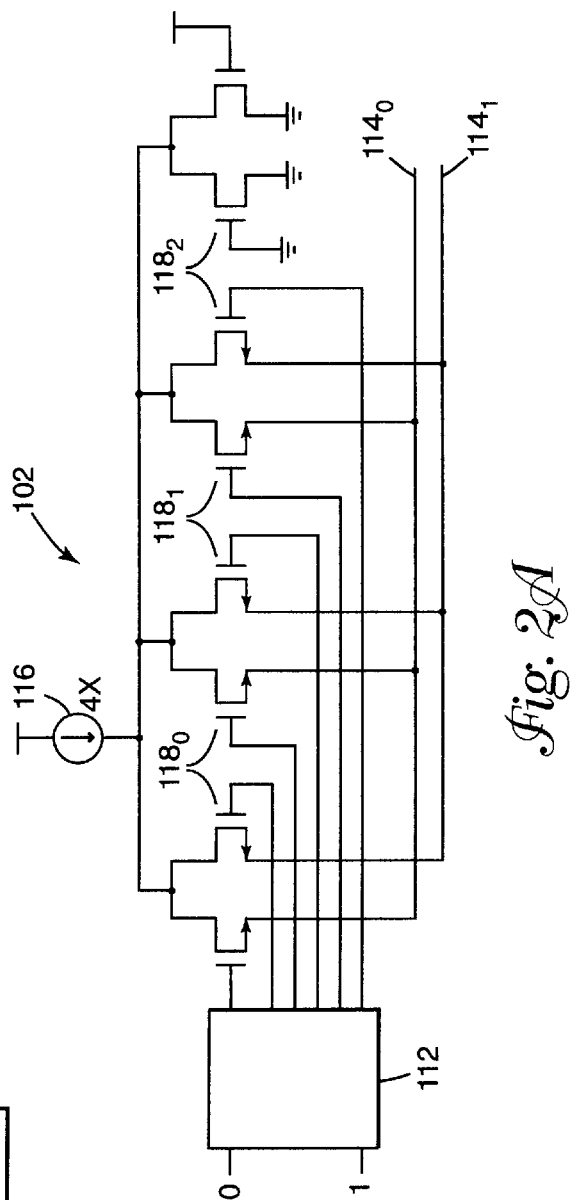
Fig. 1
Fig. 2A
Fig. 2B

SEGMENTED DAC CALIBRATION CIRCUITRY AND METHODOLOGY

TECHNICAL FIELD OF THE INVENTION

The present invention relates generally to digital-to-analog converters and in particular the present invention relates to calibrating digital-to-analog converters (DAC).

BACKGROUND OF THE INVENTION

Digital-to-analog (D/A) conversion is the process of converting digital codes into a continuous range of analog signal levels. Major factors that determine the quality of performance of DACs are resolution, sampling rate, speed, and linearity. Generally, the accuracy of the DAC's measurement and conversion is specified by the converter's linearity. "Integral linearity" is a measure of linearity over the entire conversion range. It is defined as the deviation from a straight line drawn between the maximum point and through zero (or the offset value) of the conversion range. "Differential linearity" is the linearity between adjacent steps of the analog output. Differential linearity is a measure of the monotonicity of the converter. The converter is said to be monotonic if increasing input values result in increasing output values.

Digital codes are typically converted to analog voltages by assigning a voltage weight, or current weight, to each bit in the digital code and summing the voltage or current weights of the entire code. This type of DAC is called a binary weighted DAC. DACs that produce analog current outputs usually have a faster settling time and better linearity than those that produce a voltage output.

As is well known in the art, a "segmented" DAC design converts digital codes to analog signals by activating a number of weighted segments proportional to the input digital code and summing the activated segments to form the analog output signal.

Identical segments improve differential linearity by a considerable amount over a straight binary weighted implementation; however, process tolerances are generally too large to achieve the integral linearity requirements of modern high performance digital to analog converters. See U.S. Pat. No. 5,666,118, issued Sep. 9, 1997 to Gersbach and entitled "Self calibration segmented digital-to-analog converter" for description of a self-calibrating DAC. Another self-calibrating DAC is described in U.S. Pat. No. 5,446,455, issued Aug. 29, 1995 to Brooks and entitled "Auto-Calibrated Current-Mode Digital-to-Analog Converter and Method therefor". See also U.S. Pat. No. 5,955,980, issued Sep. 21, 1999 to Hanna and entitled "Circuit and Method for Calibrating a Digital-to-Analog Converter".

In non-segmented DACs, reference current sources can be calibrated using a "golden" current source to improve accuracy. In segmented DACs, two or more reference currents of appropriate ratio dictated by the percentage of segmentation are required to calibrate the current sources in each segment. For the reasons stated above, and for other reasons stated below which will become apparent to those skilled in the art upon reading and understanding the present specification, there is a need in the art for an improved circuit and method for calibrating segmented DACs.

SUMMARY OF THE INVENTION

The above-mentioned problems with digital to analog converters and other problems are addressed by the present invention and will be understood by reading and studying the following specification.

In one embodiment, a segmented digital to analog converter (DAC) circuit comprises a plurality of sub-DACs to receive digital input signals and provide an analog output. The plurality of sub-DACs each comprises current source circuits. A reference generator circuit provides calibration currents to each of the plurality of sub-DACs, and a primary calibration current source is coupled to the reference generator circuit to calibrate the calibration currents for each of the plurality of sub-DACs.

In another embodiment, a segmented digital to analog converter (DAC) circuit comprises first, second and third sub-DACs to receive digital input signals and provide an analog output. The first, second and third sub-DACs each comprise current source circuits that comprise a sourcing current source, and a transistor coupled in parallel to the sourcing current source. The gate of the transistor is coupled to the drain to receive a voltage such that the sourcing current source and the transistor conduct a sum current equal to a calibration current. A reference generator circuit provides calibration currents to each of the first, second and third sub-DACs, and a primary calibration current source coupled to provide a $I_{unit}$ current to the reference generator circuit to calibrate the calibration currents for each of the first, second and third sub-DACs.

In yet another embodiment, a 10-bit segmented digital to analog converter (DAC) circuit comprises a first sub-DAC to convert two least significant digital inputs into a first analog current. The first sub-DAC comprises a first decoder and a plurality of first current sources each providing a current of 1×. A second sub-DAC converts four intermediate digital inputs into a second analog current. The second sub-DAC comprises a second decoder and a plurality of second current sources each providing a current of 4×. A third sub-DAC converts four most significant digital inputs into a third analog current. The third sub-DAC comprises a third decoder and a plurality of third current sources each providing a current of 64×. A reference generator circuit provides calibration currents of 4×, 4× and 64× to the first, second and third sub-DACs, respectively. A primary calibration current source coupled to the reference generator circuit provides a primary calibration current of 4× to calibrate the 4× and 64× calibration currents.

A method of calibrating a segmented digital to analog converter (DAC) circuit comprises providing a master calibration current, calibrating a plurality of reference currents using the master calibration current, coupling each of the plurality of reference currents to respective DAC segments, and calibrating current sources of the DAC segments using the plurality of reference currents.

Another method of calibrating a three-segmented 10-bit digital to analog converter (DAC) circuit comprises providing a master calibration current, calibrating a first and second reference currents using the master calibration current, coupling each of the first and second reference currents to first and second DAC segments, and calibrating current sources of the first and second DAC segments using the first and second reference currents.

BRIEF DESCRIPTION OF THE DRAWINGS

FIG. 1 is a block diagram of a digital-to-analog converter (DAC) of an embodiment of the present invention;

FIG. 2A illustrates a first sub-DAC of the circuit of FIG. 1;

FIG. 2B illustrates an alternative embodiment of first sub-DAC of the circuit of FIG. 1;

DETAILED DESCRIPTION OF THE INVENTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Referring to FIG. 1, a block diagram of a ten-bit DAC 100 of one embodiment of the present invention is described. The DAC receives ten digital input bits 0–9. The input bits are converted by three sub-DACs. The first sub-DAC 102 converts the two least significant input bits (LSB) to an analog signal. The second sub-DAC 104 converts the next four significant input bits. Finally, the third sub-DAC 106 converts the four most significant input bits (MSB) to analog signal. As explained below, each sub-DAC uses a reference current provided by a current generator circuit 108. The current generator circuit is coupled to a "golden" current source 110, also referred to a primary calibration current source. The generator circuit uses a golden reference current to calibrate three references currents 111, 113 and 115. These reference currents are used by each of the three sub-DACs to calibrate internal current sources used to convert the digital input data to an analog value.

Figure 3:
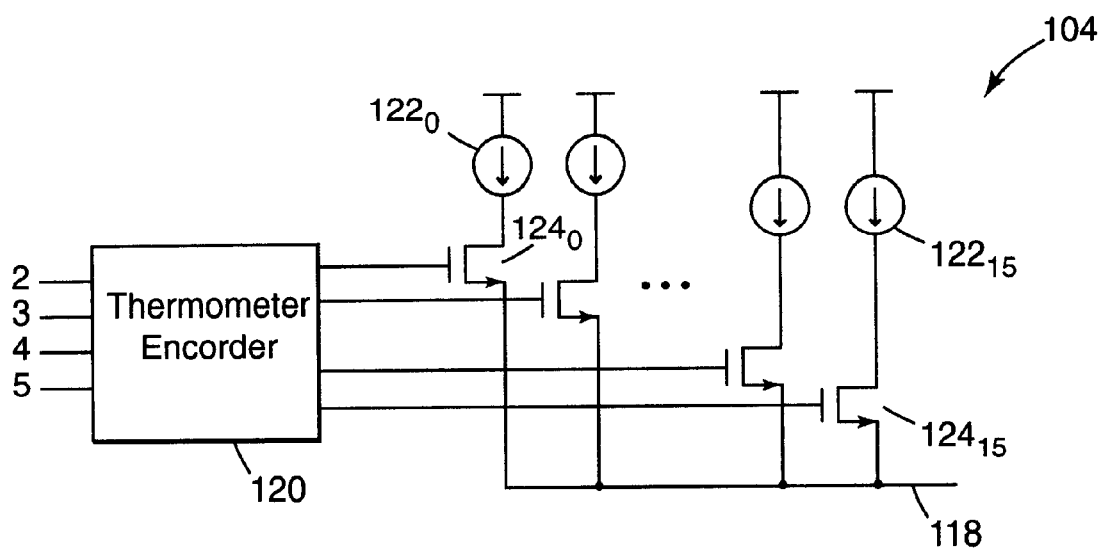
FIG. 3 illustrates a second sub-DAC of the circuit of FIG. 1.
Figure 4:
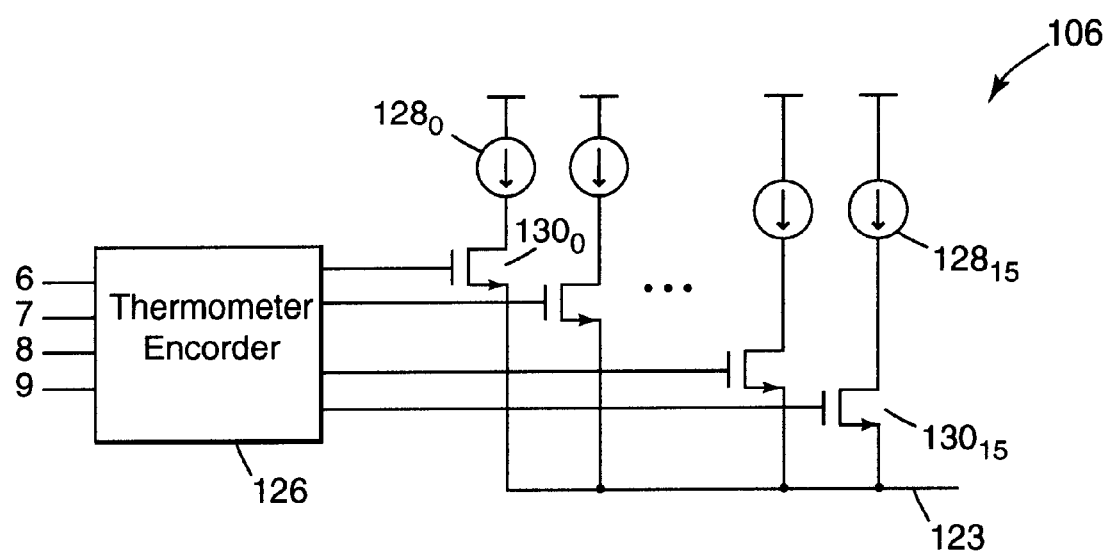
FIG. 4 illustrates a third sub-DAC of the circuit of FIG. 1.

The present invention is described herein using an x-y-z segmented n-bit DAC. In the embodiment of FIG. 1, the x-y-z segmented DAC is a 4-4-2 DAC. The first x (4) most significant input bits are converted to an analog signal in a sub-DAC 106. The next y (4) input bits are converted using a second sub-DAC 104. Finally, the remaining z (2) input bits are converted using a third sub-DAC 102. Within each of the three segments, thermometer coding is used to control unit current sources. In the case of a single-ended output, each unit current source is connected to a switch controlled by a signal from a binary-to-thermometer decoder. In the case of a fully differential output DAC, each current source is connected to a differential switch controlled by complementary signals from a binary to thermometer decoder. Thermometer decoders are well known in the art, therefore, detailed descriptions of the thermometer decoders are not provided herein. FIG. 2A illustrates a differential output sub-DAC 102, and FIGS. 3 and 4 illustrate single ended sub-DACs 104 and 106. Each unit current in a sub-DAC is the same. The number of unit current sources required in each single ended sub-DAC is defined by $2^{input}-1$. Thus, sub-DACs 104 and 106 both use $2^4-1$ unit current sources.

The unit currents for the three sub-DACs are different. That is, if the unit current for the least significant sub-DAC is $I_{unit}$, also referred to as X. The unit current provided by the current sources of sub-DAC 104 is $2^{z*}$ $I_{unit}$, or $4*$ $I_{unit}$, referred to a 4x. Likewise, the unit current provided by the current sources of sub-DAC 106 is $2^{y+x*}$ $I_{unit}$, or $64*$ $I_{unit}$ referred to as 64x.

FIG. 2A illustrates a thermometer decoder 112 of sub-DAC 102. The decoder controls differential switches $118_{0-2}$ with the complementary signals. The schematic is shown for a differential output DAC. In operation, the decoder activates the differential switches in response to the input signals. If the input signals are binary zero, 3x of 116 are coupled to one of the output, i.e., $114_0$ and zero current to the other output $114_1$. Vice versa, a binary three couples 3x of 116 to $114_1$ and zero current to $114_0$. Current source 116 provides a current of 4x. The current source can be calibrated as explained below. In another embodiment (FIG. 2B), the decoder control transistor switches $118_{0-2}$ to couple current source $116_{0-2}$ to output 114. In operation, the decoder activates the transistor in response to the input signals. If the output signals (0–1) are all zero, no transistors are activated. Likewise, a binary three activates all three transistors. The current sources are combined to provide an analog output current. Current sources 116 have a 1x unit current $I_{unit}$. As such inputs 0–2 can provide an output current that has an analog value of up to 3 unit currents. It is not necessary to calibrate current sources 116 since accuracy of sub-DAC1 is not critical. In yet another embodiment, current sources 116 can be calibrated. In this case, the reference current 111 has a current value of 1x.

FIG. 3 illustrates a thermometer decoder 120 of sub-DAC 104. The decoder controls transistor switches $124_{0-15}$ to couple current sources $122_{0-15}$ to output 118. In operation, the decoder activates the transistors in response to the input signals. If the input signals (2–5) are all zeros, no transistors are activated. Likewise, if all input signals are ones, all fifteen transistors are activated. The current sources are combined to provide an analog output current. Current sources 122 have a 4x unit current, $4I_{unit}$, and are calibrated using reference current 113 (FIG. 1). Output current on node 118 is combined with output current on node 114. As such, inputs 0–5 can provide an output current that has an analog value of up to 63 unit currents.

FIG. 4 illustrates a thermometer decoder 126 of sub-DAC 106. The decoder controls transistor switches $130_{0-15}$ to couple current sources $128_{0-15}$ to output 123. In operation, the decoder activates the transistors in response to the input signals. If the input signals (6–9) are all zeros, no transistors are activated. Likewise, if all input signals are ones, all fifteen transistors are activated. The current sources are combined to provide an analog output current. Current sources 128 have a 64x unit current, $64I_{unit}$, and are calibrated using reference current 115 (FIG. 1). Output current on node 123 is combined with output currents on nodes 114 and 118. As such, inputs 0–9 can provide an output current that has an analog value of up to 1023 unit currents.

As explained above, current mismatches between the sub-DACs results in overall DAC non-linearity. While calibration of the current sources can be performed, the current sources for each sub-DAC 102, 104 and 106 have different magnitudes and cannot be calibrated to a single current reference source. The present invention provides a two-level calibration technique. That is, each of the current sources of each sub-DAC is calibrated to a reference current 111, 113 or 115 and these reference currents are calibrated to a single "golden" reference current that is equal to $4I_{unit}$.

In one embodiment, the golden reference current source 110 provides a sourcing current. The generator circuit 108 includes a number of sinking current sources that are calibrated to the golden current. These sinking sources are grouped together to provide the reference currents for the sub-DACs. The current sources of the sub-DACs, in this embodiment, are sourcing type current sources that are calibrated to the generated reference currents.

Figure 5:
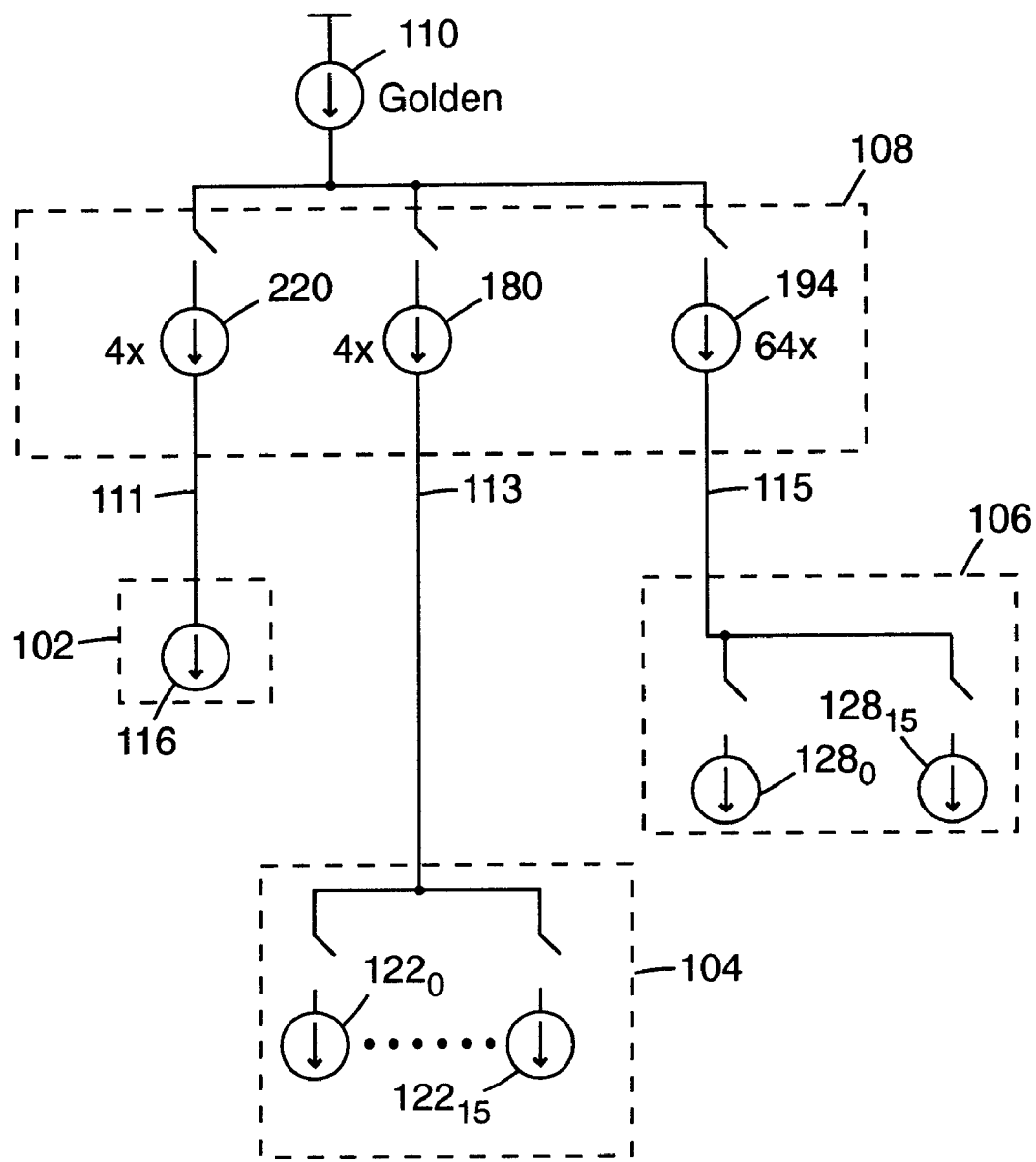
FIG. 5 is a conceptual illustration of a dual calibration technique.

FIG. 5 provides a conceptual representation of the dual calibration technique of the present invention. The golden reference current source 110 provides a current of $4I_{unit}$ that is used to calibrate current sources of generator circuit 108. Output currents 111, 113 and 115 provide output currents of $4I_{unit}$, $4I_{unit}$, and $64I_{unit}$ respectively. These currents are used to calibrate current sources of each sub-DAC 102, 104 and 106.

Figure 6:
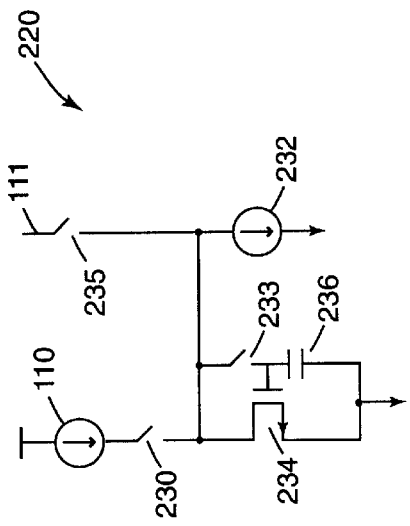
FIG. 6 is a schematic diagram of a first current source and calibration circuitry.

Referring to FIG. 6, an embodiment of first current source 180 of reference generator 108 is described. Current source 180 provides $4I_{unit}$ current on node 113 for sub-DAC 104. The current source is calibrated to the golden current source 110 using switches 182, 185 and 192. Current source 188 conducts about 90% of the desired output current. As explained above, the gate of transistor 184 is charged to a voltage level that allows transistor 184 and current source 188 to conduct a total current of $4I_{unit}$. Thus, during calibration switches 182 and 185 are closed to charge capacitor 186. During operation, the output current 113 is coupled to sub-DAC 104 by activating switch 192.

Figure 7:
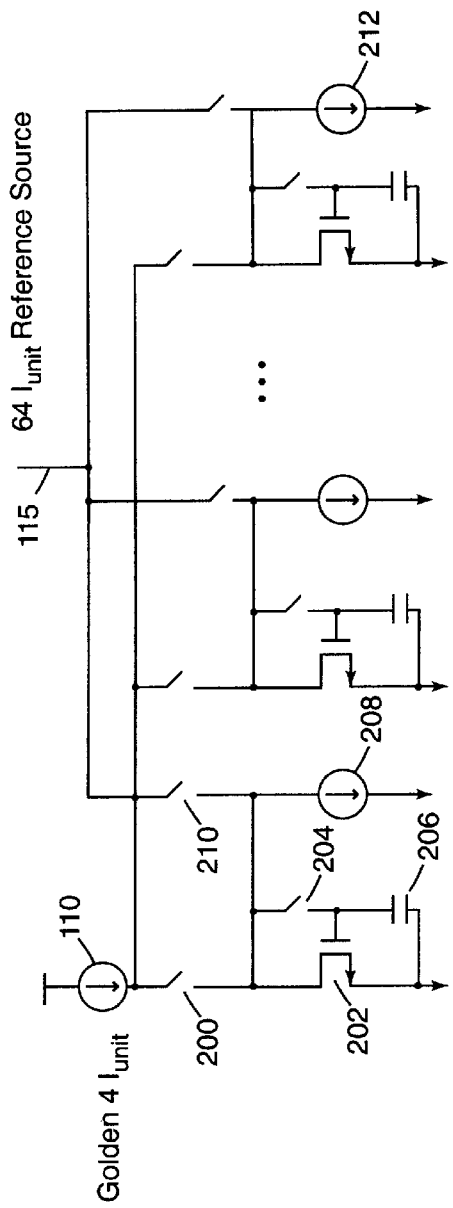
FIG. 7 is a schematic diagram of a second current source and calibration circuitry.

Referring to FIG. 7, an embodiment of second current source 194 of reference generator 108 is described. Current source 194 provides $64I_{unit}$ current on node 115 for sub-DAC 106. Current source 194 uses 16 source circuits similar to the source of FIG. 6. The 16 source circuits are calibrated to the golden current source 110 using 16 sets of switches 200, 204 and 210. Each of the 16 current sources 208 conducts about 90% of the desired output current for the source circuit. As explained above, the gate of transistor 202 is charged to a voltage level that allows transistor 202 and source 208 to conduct a total current of $4I_{unit}$ by closing switches 200 and 204. During operation, switches 210 are closed and the 16 circuits provide a total output current on node 115 that is coupled to sub-DAC 106.

Figure 8:
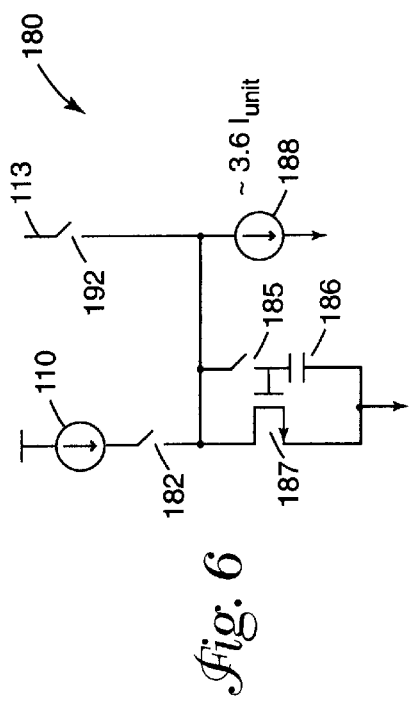
FIG. 8 is a schematic diagram of a third current source and calibration circuitry.

Referring to FIG. 8, an embodiment of third current source 220 of reference generator 108 is described. Current source 220 provides $4I_{unit}$ current node 111 for sub-DAC 102. The current source is calibrated to the golden current source 110 using switches 230, 233, and 232. Current 232 conducts about 90% of the desired output current. As explained above, the gate of transistor 234 is charged to a voltage level that allows transistor 234 and current sources 232 to conduct a total current of 4Iunit. Thus during calibration switches 230 and 233 are closed to charge capacitor 236. During operation, the output current 111 is coupled to sub-DAC 102 by activating switch 235.

Figure 9:
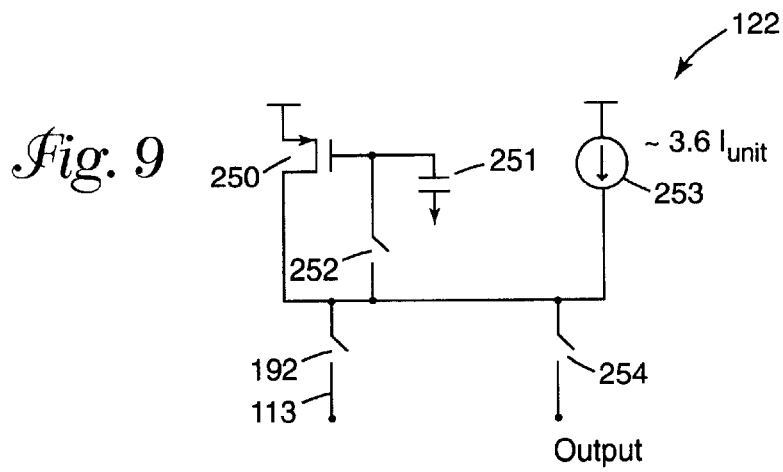
FIG. 9 illustrates a dual calibration of an embodiment of the present invention.

FIG. 9 illustrates an embodiment of current source 122. The current source is coupled to node 113 via switch 192 to calibrate. As explained above, the gate of transistor 250 is charged using switch 252 and capacitor 251. During operation, switch 192 is open and switch 254 is closed to provide a current on the output. Source 253 provides about 90% of $4I_{unit}$.

Figure 10:
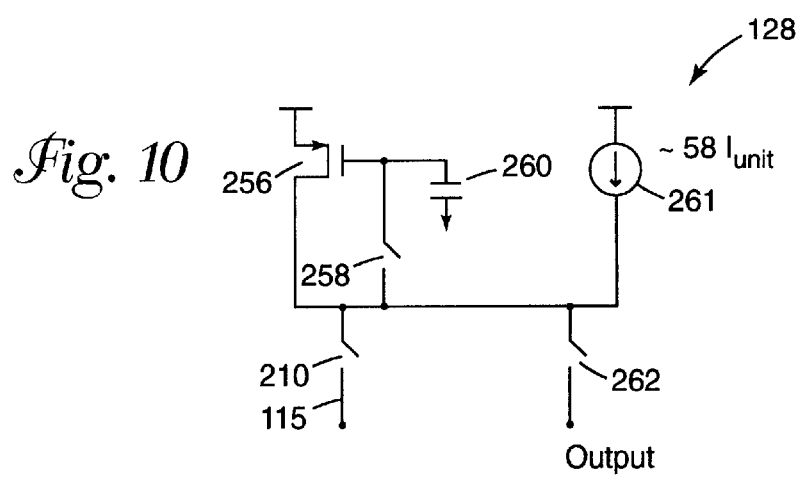
FIG. 10 illustrates an embodiment of a current source.

FIG. 10 illustrates an embodiment of current source 128. The current source is coupled to node 115 via switch 210 to calibrate. As explained above, the gate of transistor 256 is charged using switch 258 and capacitor 260. During operation, switch 210 is open and switch 262 is closed to provide a current on the output. Source 261 provides about $58I_{unit}$.

Figure 11:
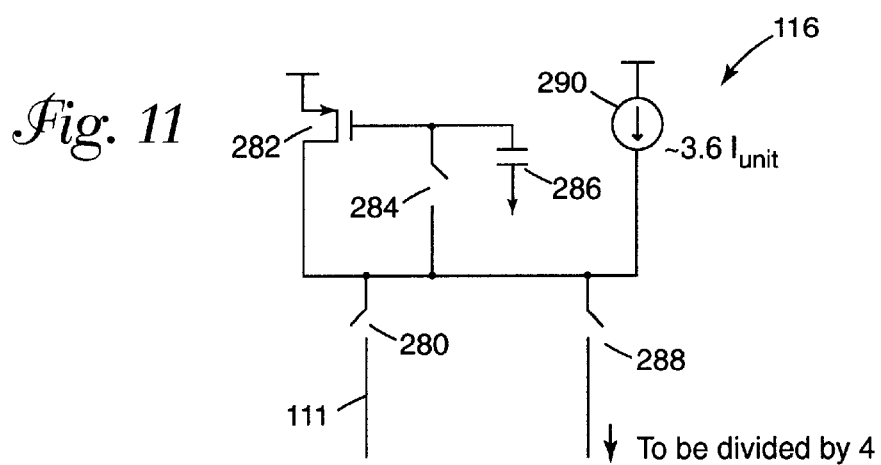
FIG. 11 illustrates an embodiment of another current source.

FIG. 11 illustrates an embodiment of current source 116. The current source is coupled to node 111 via switch 280 to calibrate. As explained above, the gate of transistor 282 is charged using switch 284 and capacitor 286. During operation, switch 280 is open and switch 288 is closed to provide a current, which is then to be divided by four to generate 4 equal currents of value $I_{unit}$. Three of which are used for sub-DAC1. Source 290 provides about 90% of $4I_{unit}$.

CONCLUSION

A segmented digital-to-analog converter (DAC) has been described that uses a two-step calibration process to calibrate current sources to a single primary reference source. In one embodiment, the DAC includes sub-DACs, a reference generator circuit and a primary, or golden, reference source. Current sources of both the sub-DACs and the reference generator are calibrated to a golden current source or primary reference current. In one embodiment, the current sources each include a transistor coupled so that a gate voltage can be adjusted during calibration. The multiple current sources of the reference generator are first calibrated to the primary reference source. The calibrated output currents of the reference generator are then used to calibrate the sub-DACs.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A segmented digital to analog converter (DAC) circuit comprising:

a plurality of sub-DACs to receive digital input signals and provide an analog output, wherein the plurality of sub-DACs each comprise current source circuits;

a reference generator circuit to provide calibration currents to each of the plurality of sub-DACs, wherein the reference generator circuit comprises at least one reference current source and at least one charging capacitor to generate the calibration currents; and a primary calibration current source coupled to the reference generator circuit to calibrate the calibration currents for each of the plurality of sub-DACs.

2. The segmented DAC circuit of claim 1 wherein the plurality of sub-DACs receive ten digital input signals and comprise first, second and third sub-DACs.

3. The segmented DAC circuit of claim 2 wherein the first sub-DAC converts two least significant digital inputs into a first analog current, the second sub-DAC converts four intermediate digital inputs into a second analog current, and the third sub-DAC converts four most significant digital inputs into a third analog current.

4. The segmented DAC circuit of claim 3 wherein the primary calibration current source provides a current of $4I_{unit}$ and the reference generator provides reference currents of $4I_{unit}$, $4I_{unit}$, and $64I_{unit}$ to the first, second and third sub-DACs, respectively.

5. The segmented DAC circuit of claim 3 wherein a primary calibration current source provides a current of $I_{unit}$ and the reference generator provides reference currents of $I_{unit}$, $4I_{unit}$, and $64I_{unit}$ to the first, second, and third sub-DACs, respectively.

6. The segmented DAC circuit of claim 3 wherein a primary calibration current source provides a current of $4I_{unit}$ and the reference generator provides reference currents of $4I_{unit}$, and $64I_{unit}$ to the second and third sub-DACs, respectively.

7. The segmented DAC circuit of claim 1 wherein the current source circuits of the plurality of sub-DACs each comprise:
    a sourcing current source; and
    a transistor coupled in parallel to the sourcing current source, wherein a gate of the transistor is coupled to receive a voltage such that the sourcing current source and the transistor conduct a sum current equal to a predetermined value.

8. A segmented digital to analog converter (DAC) circuit comprising:
    first, second and third sub-DACs to receive digital input signals and provide an analog output, wherein the first, second and third sub-DACs each comprise current source circuits comprising a sourcing current source, and a transistor coupled in parallel to the sourcing current source, wherein a gate of the transistor is coupled to receive a voltage such that the sourcing current source and the transistor conduct a sum current equal to a predetermined value;
    a reference generator circuit to provide calibration currents to each of the first, second and third sub-DACs; and
    a primary calibration current source coupled to provide a $4I_{unit}$ current to the reference generator circuit to calibrate the calibration currents for each of the first, second and third sub-DACs.

9. The segmented DAC circuit of claim 8 wherein the calibration currents for the first, second and third sub-DACs are $4I_{unit}$, $4I_{unit}$ and $64I_{unit}$, respectively.

10. The segmented DAC circuit of claim 9 wherein the calibration currents for the first, second, and third sub-DACs are $I_{unit}$, $4I_{unit}$ and $64I_{unit}$, respectively.

11. A segmented digital to analog converter (DAC) circuit comprising:
    first, second and third sub-DACs to receive digital input signals and provide an analog output, wherein the first, second and third sub-DACs each comprise current source circuits comprising a sourcing current source, and a transistor coupled in parallel to the sourcing current source, wherein a gate of the transistor is coupled to receive a voltage such that the sourcing current source and the transistor conduct a sum current equal to a predetermined value;
    a reference generator circuit to provide calibration currents to each of the first, second and third sub-DACs; and
    a primary calibration current source coupled to provide a $I_{unit}$ current to the reference generator circuit to calibrate the calibration currents for each of the first, second, and third sub-DACs.

12. A 10-bit segmented digital to analog converter (DAC) circuit comprising:
    a first sub-DAC to convert two least significant digital inputs into a first analog current, the first sub-DAC comprises a first decoder and a plurality of first current sources each providing a current of 1×;
    a second sub-DAC to convert four intermediate digital inputs into a second analog current, the second sub-DAC comprises a second decoder and a plurality of second current sources each providing a current of 4×;
    a the third sub-DAC to convert four most significant digital inputs into a third analog current, the third sub-DAC comprises a third decoder and a plurality of third current sources each providing a current of 64×;
    a reference generator circuit to provide calibration currents of 1×, 4× and 64× to the first, second and third sub-DACs, respectively; and
    a primary calibration current source coupled to the reference generator circuit to provide a primary calibration current of 1× to calibrate the 1×, 4× and 64× calibration currents.

13. The 10-bit segmented DAC of claim 12 wherein the first, second and third encoders are thermometer encoder circuits.

14. The 10-bit segmented DAC of claim 12 wherein the plurality of first current sources each comprise a current source circuit coupled in parallel to a transistor, wherein the current source circuit and the transistor conduct a sum current of 1×.

15. The 10-bit segmented DAC of claim 14 wherein the transistor has a gate voltage stored on a capacitor that is charged during equilibration.

16. The 10-bit segmented DAC of claim 12 wherein the first current source comprises a current source circuit coupled in parallel to a transistor, wherein the current source circuit and the transistor conduct a sum current of 4×, to be divided by four to provide four 4 equal currents 1×.

17. The 10-bit segmented DAC of claim 12 wherein the plurality of second current sources each comprise a current source circuit coupled in parallel to a transistor, wherein the current source circuit and the transistor conduct a sum current of 4×.

18. The 10-bit segmented DAC of claim 17 wherein the transistor has a gate voltage stored on a capacitor that is charged during equilibration.

19. The 10-bit segmented DAC of claim 12 wherein the plurality of third current sources each comprise a current source circuit coupled in parallel to a transistor, wherein the current source circuit and the transistor conduct a sum current of 64×.

20. The 10-bit segmented DAC of claim 12 wherein the transistor has a gate voltage stored on a capacitor that is charged during equilibration.

21. The 10-bit segmented DAC of claim 12 wherein the reference generator comprises a 4× current source circuit comprising:
    a current source to conduct a current of about 90% of 4×;
    a transistor coupled in parallel to the current source; and
    a capacitor coupled to a gate of the transistor, wherein the capacitor is charged during a calibration operation such that the transistor and current source conduct a calibrated current of 4×.

22. The 10-bit segmented DAC of claim 12 wherein the reference generator comprises a sixteen 4× current source circuits coupled to provide the 64× calibration current, each of the 4× current sources comprise:

a current source to conduct a current of about 90% of 4x;

a transistor coupled in parallel to the current source; and a capacitor coupled to a gate of the transistor, wherein the capacitor is charged during a calibration operation such that the transistor and current source conduct a calibrated current of 4x.

23. A method of calibrating a segmented digital to analog converter (DAC) circuit comprising:

providing a master calibration current;

calibrating a plurality of reference currents using the master calibration current;

grouping pluralities of reference currents to provide desired reference current values;

coupling each of the plurality of reference currents to respective DAC segments; and calibrating current sources of the DAC segments using the plurality of reference currents.

24. The method of claim 23 wherein the master calibration current is 4x and the plurality of reference currents comprise 4x, 4x and 64x currents.

25. The method of claim 23 wherein the master calibration current is 1x and the plurality of reference currents comprise 1x, 4x, and 64x currents.

26. A method of calibrating a three-segmented 10-bit digital to analog converter (DAC) circuit comprising:

providing a master calibration current;

calibrating a first, second and third of reference currents using the master calibration current;

coupling each of the first, second and third reference currents to first, second and third DAC segments; and calibrating current sources of the first, second and third DAC segments using the first, second and third reference currents.

27. The method of claim 26 wherein the master calibration current is 1x and the plurality of reference currents comprise 1x, 4x, and 64x currents.

28. The method of claim 27 wherein the second reference current is provided by a reference current source comprising a current source coupled in parallel with a transistor, and calibrating the second reference current comprises charging a gate of the transistor such that the transistor and the current source conduct the same current as the master calibration current.

29. The method of claim 27 wherein the third reference current is provided by 16 reference current sources each comprising a current source coupled in parallel with a transistor, and calibrating the third reference current comprises charging a gate of each transistor such that each transistor and one of the current sources conduct the same current as the master calibration current.

30. The method of claim 26 wherein the master calibration current is 4x and the plurality of reference currents comprise 4x, 4x and 64x currents.

31. The method of claim 30 wherein the first reference current is provided by a reference current source comprising a current source coupled in parallel with a transistor, and calibrating the first reference current comprises charging a gate of the transistor such that the transistor and the current source conduct the same current as the master calibration current.

32. The method of claim 30 wherein the second reference current is provided by a reference current source comprising a current source coupled in parallel with a transistor, and calibrating the second reference current comprises charging a gate of the transistor such that the transistor and the current source conduct the same current as the master calibration current.

33. The method of claim 30 wherein the third reference current is provided by 16 reference current sources each comprising a current source coupled in parallel with a transistor, and calibrating the third reference current comprises charging a gate of each transistor such that each transistor and one of the current sources conduct the same current as the master calibration current.

* * * * *